(12) United States Patent
Ransom et al.

(10) Patent No.: US 8,062,941 B1
(45) Date of Patent: Nov. 22, 2011

(54) ESD PROTECTION TRANSISTOR

(75) Inventors: John A. Ransom, Nampa, ID (US);
Brett D. Lowe, Boise, ID (US); Michael J. Westphal, Boise, ID (US)

(73) Assignee: IXYS CH GmbH (CH)

( * ) Notice: Subject to any disclaimer, the term of this patent is extended or adjusted under 35 U.S.C. 154(b) by 0 days.

(21) Appl. No.: 13/065,940

(22) Filed: Apr. 2, 2011

Related U.S. Application Data

(63) Continuation of application No. 12/807,669, filed on Sep. 10, 2010, now Pat. No. 7,927,944, which is a continuation of application No. 12/383,534, filed on Mar. 24, 2009, now Pat. No. 7,807,528, which is a continuation of application No. 11/118,680, filed on Apr. 29, 2005, now Pat. No. 7,508,038.

(51) Int. Cl.
*H01L 21/8238* (2006.01)

(52) U.S. Cl. ........ 438/199; 438/200; 438/238; 438/382; 257/355; 257/356; 257/360

(58) Field of Classification Search .................. 438/238, 438/382, 197, 199, 200; 257/355, 356, 360
See application file for complete search history.

(56) References Cited

U.S. PATENT DOCUMENTS

| | | | | |
|---|---|---|---|---|
| 5,290,724 A | 3/1994 | Leach | | 437/51 |
| 5,468,984 A * | 11/1995 | Efland et al. | | 257/356 |
| 5,493,142 A | 2/1996 | Randazzo et al. | | 257/328 |
| 5,498,892 A | 3/1996 | Walker et al. | | 257/336 |
| 5,683,918 A | 11/1997 | Smith et al. | | 437/21 |
| 5,705,841 A | 1/1998 | Yu | | 257/355 |
| 6,064,249 A * | 5/2000 | Duvvury et al. | | 327/314 |
| 6,100,125 A | 8/2000 | Hulfachor et al. | | 438/224 |
| 6,100,127 A | 8/2000 | Wu | | 438/238 |
| 6,713,818 B2 | 3/2004 | Kodama | | 257/362 |
| 6,830,966 B2 | 12/2004 | Cai et al. | | 438/197 |
| 6,838,734 B2 | 1/2005 | Ker et al. | | 257/360 |
| 6,844,597 B2 | 1/2005 | Baird et al. | | 257/355 |
| 6,882,011 B1 | 4/2005 | Chen | | 257/355 |
| 6,893,926 B2 | 5/2005 | Kikuchi et al. | | 438/286 |
| 7,193,269 B2 | 3/2007 | Toda et al. | | 257/328 |
| 2005/0032275 A1 | 2/2005 | Toda et al. | | 438/123 |
| 2006/0043491 A1 | 3/2006 | Lee et al. | | 257/355 |

* cited by examiner

*Primary Examiner* — Thinh T Nguyen
(74) *Attorney, Agent, or Firm* — Imperium Patent Works; Darien K. Wallace; T. Lester Wallace

(57) ABSTRACT

An electrostatic discharge (ESD) transistor structure includes a self-aligned outrigger less than 0.4 microns from a gate electrode that is 50 microns wide. The outrigger is fabricated on ordinary logic transistors of an integrated circuit without severely affecting the performance of the transistors. The outrigger is used as an implant blocking structure to form first and second drain regions on either side of a lightly doped region that underlies the outrigger. The self-aligned outrigger and the lightly doped region beneath it are used to move the location of avalanche breakdown upon an ESD event away from the channel region. Durability is extended when fewer "hot carrier" electrons accumulate in the gate oxide. A current of at least 100 milliamperes can flow into the drain and then through the ESD transistor structure for a period of more than 30 seconds without causing a catastrophic failure of the ESD transistor structure.

13 Claims, 14 Drawing Sheets

STEP 1 - CAPACITOR OXIDE DEPOSITION; 500 — 1000 Å
STEP 2 - CAPACITOR POLY (AMORPHOUS) DEPOSITION; 1500 — 3000 Å
STEP 3 - CAPACITOR POLY DOPING
STEP 4 - CAPACITOR POLY DOPING ACTIVATION
STEP 5 - SPACER DEPOSITION; 500 — 3000 Å
 OPTIONAL STEP 5A - CMOS PROTECTION GATE MASK
 OPTIONAL STEP 5B - CMOS PROTECTION GATE ISOTROPIC ETCH
 OPTIONAL STEP 5C - PHOTORESIST STRIP
STEP 6 - SPACER ANISOTROPIC ETCH
STEP 7 - CAPACITOR POLY PHOTOMASK
STEP 8 - CAPACITOR POLY ETCH
STEP 9 - PHOTORESIST AND SPACER STRIP
STEP 10 - NLDD MASK
STEP 11 - NLDD AND PUNCHTHROUGH INMPLANT
STEP 12 - NLDD PHOTORESIST STRIP
STEP 13 - STANDARD CMOS SPACER OXIDE DEPOSITION; 2000 — 2500 Å
STEP 14 - STANDARD CMOS SPACER OXIDE ETCH
STEP 15 - S/D IMPLANT SCREEN OXIDATION; 100 — 200 Å
STEP 16 - N+ S/D IMPLANT MASK
STEP 17 - N+ S/D ARSENIC IMPLANT
STEP 18 - N+ S/D IMPLANT MASK PHOTORESIST STRIP
STEP 19 - P+ IMPLANT PROCESSING — WELL CONTACT REGION
STEP 20 - BPSG DEPOSITION
STEP 21 - BPSG DENSIFICATION; 900 — 950 C IN OXYGEN CONTAINING AMBIENT
STEP 22 - CONTACT PATTERNING AND ETCH
STEP 23 - CONTACT RTP RELOW; 20 — 40 SECONDS AT 900 — 950 C
STEP 24 - INTERCONNECT METALIZATION AND PASSIVATION PROCESSING

STEP 1 - CAPACITOR OXIDE DEPOSITION; 500 — 1000 Å (FIGURE 16)
STEP 2 - CAPACITOR POLY (AMORPHOUS) DEPOSITION; 1500 — 3000 Å (FIGURE 17)
STEP 3 - CAPACITOR POLY DOPING
STEP 4 - CAPACITOR POLY DOPING ACTIVATION
STEP 5 - SPACER DEPOSITION; 500 — 3000 Å (FIGURE 18)
OPTIONAL STEP 5A - CMOS PROTECTION GATE MASK
OPTIONAL STEP 5B - CMOS PROTECTION GATE ISOTROPIC ETCH
OPTIONAL STEP 5C - PHOTORESIST STRIP
STEP 6 - SPACER ANISOTROPIC ETCH (FIGURE 19)
STEP 7 - CAPACITOR POLY PHOTOMASK
STEP 8 - CAPACITOR POLY ETCH (FIGURE 20)
STEP 9 - PHOTORESIST AND SPACER STRIP (FIGURE 21)
STEP 10 - NLDD MASK
STEP 11 - NLDD AND PUNCHTHROUGH INMPLANT (FIGURE 22)
STEP 12 - NLDD PHOTORESIST STRIP
STEP 13 - STANDARD CMOS SPACER OXIDE DEPOSITION; 2000 — 2500 Å
STEP 14 - STANDARD CMOS SPACER OXIDE ETCH
STEP 15 - S/D IMPLANT SCREEN OXIDATION; 100 — 200 Å
STEP 16 - N+ S/D IMPLANT MASK
STEP 17 - N+ S/D ARSENIC IMPLANT (FIGURE 23)
STEP 18 - N+ S/D IMPLANT MASK PHOTORESIST STRIP
STEP 19 - P+ IMPLANT PROCESSING — WELL CONTACT REGION
STEP 20 - BPSG DEPOSITION
STEP 21 - BPSG DENSIFICATION; 900 — 950 C IN OXYGEN CONTAINING AMBIENT
STEP 22 - CONTACT PATTERNING AND ETCH
STEP 23 - CONTACT RTP RELOW; 20 — 40 SECONDS AT 900 — 950 C
STEP 24 - INTERCONNECT METALIZATION AND PASSIVATION PROCESSING (FIGURE 10)

ESD PROTECTION TRANSISTOR

CROSS REFERENCE TO RELATED APPLICATION

This application is a continuation of, and claims priority under 35 U.S.C. §120 from, nonprovisional U.S. patent application Ser. No. 12/807,669 entitled "ESD Protection Transistor," filed on Sep. 10, 2010, now U.S. Pat. No. 7,927,944. Application Ser. No. 12/807,669 in turn is a continuation of, and claims priority under 35 U.S.C. §120 from, nonprovisional U.S. patent application Ser. No. 12/383,534 entitled "ESD Protection Transistor," filed on Mar. 24, 2009, now U.S. Pat. No. 7,807,528. Application Ser. No. 12/383,534 in turn is a continuation of, and claims priority under 35 U.S.C. §120 from, nonprovisional U.S. patent application Ser. No. 11/118,680 entitled "ESD Protection Transistor," filed on Apr. 29, 2005, now U.S. Pat. No. 7,508,038. The subject matter of these three patent documents is incorporated herein by reference.

TECHNICAL FIELD

The present invention relates generally to electrostatic discharge (ESD) protection transistors, and more particularly to an ESD protection transistor having a hot carrier injection site that is laterally displaced from the channel region of the transistor.

BACKGROUND INFORMATION

Small logic transistors on an integrated circuit can be damaged by high voltages. Within an integrated circuit, placing a high voltage on the source or drain of a transistor with respect to the gate can cause the thin gate oxide of the transistor to break down. High static voltages can develop on the human body. High static voltages of two thousand volts can, for example, be generated when materials are rubbed together as a person walks across a room. If the person who is charged to the high static voltage were then to touch a terminal of an integrated circuit where another terminal of the integrated circuit is grounded relative to the person, then a high voltage would be impressed across circuitry within the integrated circuit in what is called an ESD (electrostatic discharge) event. This high voltage may burst through various parts of the circuitry within the integrated circuit and do damage. Such ESD events can occur in handling semiconductor products and can result in damage to the semiconductor products.

FIG. 1 (Prior Art) is a perspective view that represents an ESD event. A high voltage on a person 1 is transferred to a terminal 2 of an integrated circuit package 3. This voltage is in turn communicated through the package and to a pad of the integrated circuit within the package. Because circuitry on the integrated circuit may be at ground potential due to another terminal 4 of the package being grounded, the high voltage may be impressed across sensitive circuitry in the integrated circuit, thereby damaging the circuitry.

FIG. 2 (Prior Art) is a diagram of an example of an input buffer circuit 5 on the integrated circuit that can be damaged by the ESD event. Input buffer 5 includes a P-channel pullup field effect transistor (FET) 6, and an N-channel pulldown FET 7. When the high static voltage is conducted onto pad 8 due to person 1 touching terminal 2, then a high voltage is impressed across the gate-to-source of the N-channel pulldown transistor 7. This high voltage can destroy transistor 7 and render the integrated circuit inoperable.

FIG. 3 (Prior Art) is a circuit diagram of an example of ESD protection circuitry that is employed to protect the sensitive internal transistors of the input buffer. The ESD protection circuitry includes an ESD series resistor 9 and four ESD protection structures 10-13.

FIG. 4 (Prior Art) is a simplified cross-sectional diagram of ESD protection structure 13. Many variations on this structure exist in the prior art. The structure includes a first electrode 14, a lightly doped N− type ballast resistor structure 16 disposed between two N+ type regions 17 and 18, a polysilicon gate 19, a thin layer of gate oxide 20 between the gate 19 and a channel region 21, a second electrode 22, an N+ type source region 23, and a third electrode 24. N− and N+ type regions 17, 18 and 23 extend into a P type well region 25. Although not illustrated in the diagram of FIG. 4, a well contact electrode and a P+ type well contact region are typically provided so that well region 25 can be biased in a desired manner. First electrode 14 is coupled to node 26 in FIG. 3. Second and third electrodes 22 and 24 are coupled together and to ground node 27 in FIG. 3. When a high voltage of an ESD event is introduced onto pad 8 of the structure of FIG. 3, then a high voltage is communicated through resistor 9 and to first electrode 14. Second and third electrodes 22 and 24 are coupled to grounded terminal 4 of the integrated circuit package of FIG. 1. As a result, the voltage between electrodes 14 and 24 increases rapidly resulting in rapidly expanding depletion regions around regions 17, 16 and 18.

FIG. 5 illustrates the depletion regions with dashed boundary 28.

FIG. 6 is a simplified top-down diagram of the structure of FIG. 4. Some layers of the structure have been removed in order to simplify the illustration. Region 30 is a thick field oxide that surrounds the structure. Well contacts and a well contact region are provided to provide electrical contact with the well region, but the well contacts and well contact region are not shown in the simplified diagram of FIG. 6. The square symbols in FIG. 6 represent contacts between overlaying electrodes (not illustrated) and underlying structures 23, 19, 18, and 17. An implant blocking structure 31 is disposed approximately halfway in the horizontal dimension between the right edge of polysilicon gate 19 and the contacts to drain region 17. In the example of U.S. Pat. No. 6,100,125, the implant blocking layer is formed by blanket depositing a blocking oxide layer over the structure, and then using lithography and photoresist to etch away the other parts of the oxide layer, thereby leaving implant blocking structure 31 a substantial distance away from gate 19. Implant blocking structure 31 serves to block a subsequent N+ implant from highly doping the underlying ballast resistor 16.

FIG. 7 (Prior Art) illustrates an operation of the structure of FIG. 4. As the voltage between regions 17 and 23 increases during the ESD event, the depletion region 28 grows. The large electric field across this region causes an avalanche breakdown current to start flowing from region 18 to region 23.

FIG. 8 (Prior Art) is a graph of the source-to-drain current $I_D$ as a function of the source-to-drain voltage $V_D$. The current $I_D$ is negligible as the voltage $V_D$ increases in range 32. The current $I_D$ then starts to increase due to the flow of avalanche breakdown current. This increase is within dashed oval 33.

A parasitic NPN bipolar transistor structure exists within the transistor structure of FIG. 4. The N+ type region 18 acts as the collector of this parasitic transistor. A portion of the N+ type source 23 acts as the emitter of the parasitic transistor. A portion of the semiconductor material between the N+ type region 18 and N+ type region 23 acts as the base of the parasitic transistor. FIG. 7 includes a bipolar transistor symbol that represents the parasitic NPN bipolar transistor. The avalanche current flowing between regions 18 and 23 increases to the point that some current flows into the base of the parasitic transistor. This current is illustrated by arrow 34 in FIG. 7. This base current is amplified by the NPN parasitic transistor, thereby causing the collector-to-emitter current to increase rapidly. This transistor action rapidly reduces the voltage $V_D$ back down to a safe voltage in what is sometimes called "snapback", thereby preventing a large voltage from staying on electrode 14. In the graph of FIG. 8, the voltage $V_D$ is then effectively clamped to a lower $V_D$ voltage. Snapback reduces the voltage on node 26 and protects the transistors 6 and 7 of the input buffer.

The ESD protection transistor is a large device. A problem can exist where one small part of the transistor goes into snapback, but other parts of the transistor never experience enough avalanche current to turn on the parasitic bipolar transistor of those other parts. A solution is to provide the ballast resistance of region 16. Ballast resistor 16 serves to distribute current from the drain contact along the width of the transistor during an ESD event, thereby reducing local peak current density and allowing higher current density elsewhere so as to alleviate problems of non-simultaneous turn-on. See U.S. Pat. No. 6,100,125, U.S. Pat. Nos. 5,498,892 and 6,838,734 for further details. Implant blocking structure 31 is made approximately as long (in the left-to-right dimension of FIG. 9) as the poly gate 19 so that the underlying region 16 will be resistive enough to function as an effective ballast resistor. A typical resistance for a ballast resistor is about fifty ohms.

Unfortunately, the existence of the large electric fields associated with the large depletion regions that form in the snapback scenario can cause energetic electrons to be emitted from regions within the depletion region. The emission of these "hot carrier" electrons is illustrated in FIG. 9 by the arrows. Some of the hot carrier electrons are emitted such that they accumulate in the gate oxide 20. The result is a buildup of charge that can significantly change the threshold voltage of the transistor and eventually cause the transistor to be destroyed.

Multiple techniques exist in the prior art for moving the point of hot carrier injection away from the channel region such that hot carriers do not accumulate in the gate oxide. One technique is to perform a special implant step in the ESD protection transistors of the integrated circuit. See U.S. Pat. No. 6,838,734 for one variation on this technique. The special ESD implant step results in an area of lighter doping on the side of the drain region adjacent the channel region. As a consequence, the junction covered by the ESD implantation has a higher breakdown voltage, which is lower than the junction breakdown voltage at the junction under the drain contact. The breakdown location is therefore under the drain contact and is farther away from the channel region than in the structure of FIG. 9. Performing the ESD implantation step, however, entails adding processing steps to the overall semiconductor fabrication process because the ESD implant is only performed on ESD protection transistors and not on the ordinary logic transistors within the center of the integrated circuit. Furthermore, it is sometimes undesirable in the ESD protection transistor to have a lightly doped region immediately adjacent the channel region. An alternative process and structure is desired.

SUMMARY

An electrostatic discharge (ESD) transistor structure includes an outrigger that is self-aligned in parallel with a gate electrode. The outrigger is separated from the gate electrode by at most 0.4 microns. A lightly doped silicon region underlies the outrigger. The ESD transistor structure can be fabricated around ordinary logic transistors within the center of an integrated circuit because the outrigger is used as an implant blocking structure to form a first drain region and a second drain region on either side of the lightly doped region. In addition, a capacitor structure can be formed at the same time and with the same mixed signal process that forms the outrigger.

A gate oxide and a channel region underlie the gate electrode. The gate electrode lies between a source region and the first and second drain regions. The first and second drain regions, the lightly doped region and a source region all have a first conductivity type. The first and second drain regions, however, are more heavily doped than the lightly doped region. The resistance from the first drain region to the second drain region through the lightly doped region is less than about five ohms. The channel region has a second conductivity type that is opposite the first conductivity type. The first drain region lies between the channel region and the lightly doped region. The first and second drain regions, the lightly doped region, the source region, and the channel region are set in a well or a substrate region of the same conductivity type as the channel region.

The source region is coupled to a source contact, and the substrate region is coupled to a substrate contact. The gate electrode is shorted to the source contact and to the substrate contact. The second drain region is coupled to a drain contact and to a node onto which a high voltage from an ESD event is introduced. As a voltage builds between the drain contact and the source contact during the ESD event, a large electric field across a depletion region surrounding the drain region causes an avalanche breakdown current to flow from the first and second drain regions to the source region and the substrate region. The lightly doped region deforms the shape of the depletion regions such that the avalanche breakdown begins to occur at a location near the lightly doped region and away from the channel region.

The self-aligned outrigger and the lightly doped region beneath it are used to move the location where the avalanche breakdown begins away from the channel region. Fewer electrons from the avalanche breakdown current thereby accumulate in the gate oxide, and the durability of the ESD transistor structure is extended. The avalanche breakdown current is conducted to the source region and the substrate region. The avalanche current conducted to the substrate is also used in a parasitic bipolar transistor formed by the first and second regions, the lightly doped region, the substrate region and the source region. The avalanche current conducted to the substrate is the base current of the bipolar transistor. The base current turns on the bipolar transistor, and a large amount of current is conducted from the drain regions to the source region without significantly damaging the gate oxide under the gate electrode. A current of at least 2 milliamperes per micron of channel width can flow into the first and second drain regions and then through the ESD transistor structure for a period of more than 30 seconds without causing a catastrophic failure of the ESD transistor structure.

A method of making an ESD transistor structure involves fabricating an outrigger on ordinary logic transistors of an integrated circuit without severely affecting the performance of the transistors. The method involves depositing a dielectric over a gate electrode, depositing a silicon material over the dielectric, depositing a spacer material over the silicon material, and etching the spacer material anisotropically to form a sidewall spacer. The silicon material can be polysilicon or amorphous silicon. The silicon material is then anisotropically etched to form the outrigger beneath the sidewall spacer such that the outrigger extends parallel to the gate electrode and is separated from the gate electrode by at most 0.4 microns and has a width of 0.05 microns to 0.2 microns. Thus, the sidewall spacer and the silicon material are used to self-align the resulting outrigger.

A lightly doped region is formed beneath the outrigger. Then a first drain region and a second drain region are formed on either side of the lightly doped region by using the outrigger as an implant blocking structure. The resistance from the first drain region to the second drain region through the lightly doped region is less than approximately five ohms. Finally, the outrigger and the entire ESD transistor structure are covered with a passivation layer.

The method results in the lightly doped region beneath the self-aligned outrigger that is used to move the location of avalanche breakdown current and the parasitic bipolar collector-to-emitter current, upon an ESD event, away from the gate oxide beneath the gate electrode. The durability of the ESD transistor structure is thereby extended when fewer "hot carrier" electrons accumulate in the gate oxide.

Other embodiments and advantages are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

FIG. 14 illustrates the flow of steps in a mixed signal process usable to realize the ESD transistor structure of FIG. 10.

DETAILED DESCRIPTION

Reference will now be made in detail to some embodiments of the invention, examples of which are illustrated in the accompanying drawings.

Figure 10:
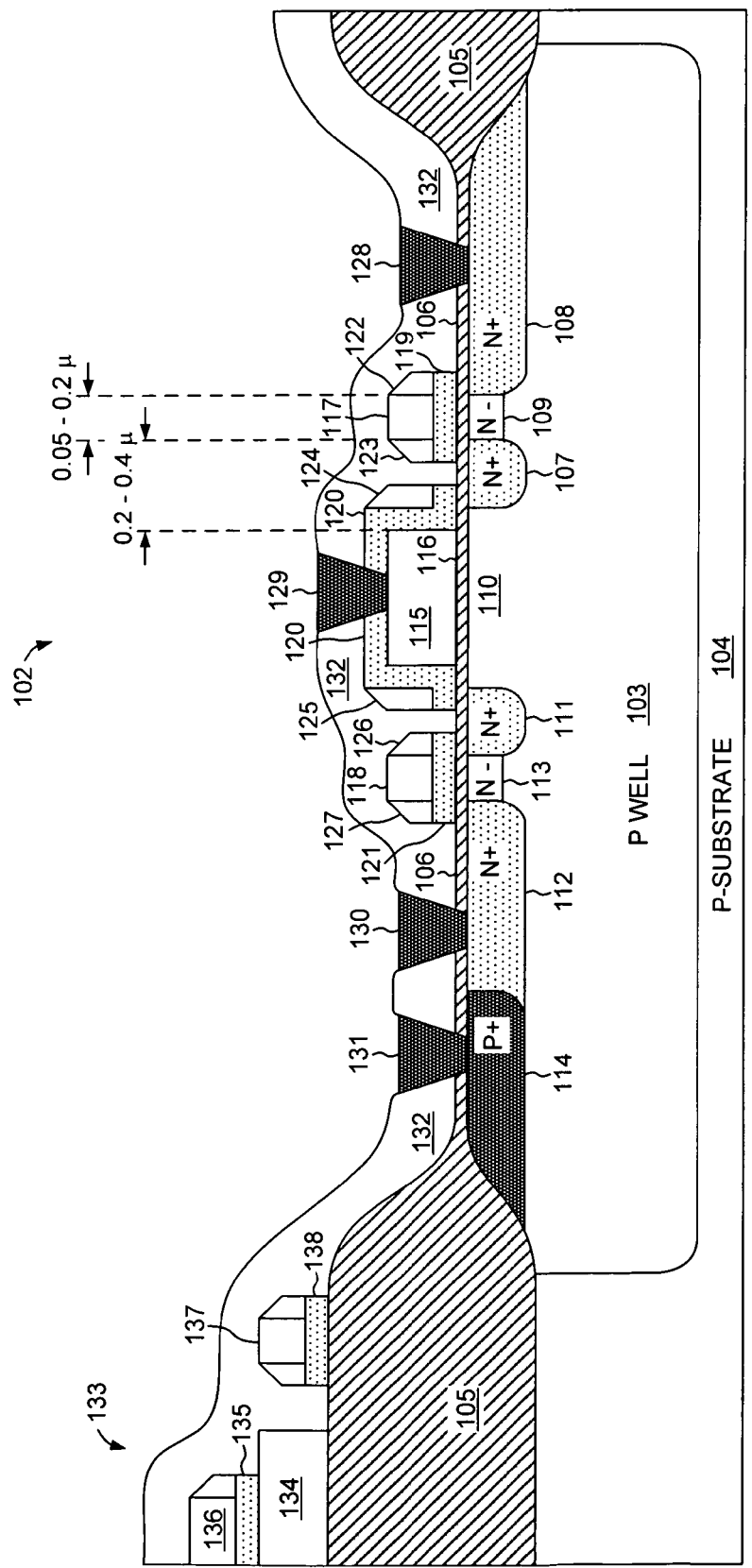
FIG. 10 is a cross-sectional diagram of an ESD transistor structure in accordance with one novel aspect.

FIG. 10 is a cross-sectional diagram of an ESD (Electrostatic Discharge) transistor structure 102 in accordance with one novel aspect. Structure 102 includes a P type well 103 that is formed in a P– type substrate semiconductor material 104. Surrounding the structure is a region of thick field oxide 105. A thin thermal oxide 106 covers the active surface area within the well. The structure includes a first N+ type drain region 107, a second N+ type drain region 108, a more lightly doped N– type lightly doped region 109 that extends between regions 107 and 108, a channel region 110, an N+ type first source region 111, an N+ type second source region 112, a more lightly doped N– type lightly doped region 113 that extends between regions 111 and 112, a P+ type well contact region 114, a polysilicon gate electrode 115 that is separated from the channel region 110 by gate oxide 116, a pair of silicon (polysilicon or amorphous silicon) outriggers 117 and 118, features 119-121 of a dielectric layer, spacers 122-127, a drain contact 128, a gate contact 129, a source contact 130, a well contact 131, and a passivation layer 132. In addition to the ESD transistor structure 102, a capacitor structure 133 is formed. Capacitor structure 133 includes a first plate 134 that is formed of the same polysilicon material that forms gate 115, a capacitor dielectric material 135 of the same material that forms features 119-121, a second plate 136 that is formed of the same polysilicon material that forms outriggers 117 and 118. An outrigger 137 of the material of the second capacitor plate is formed around the capacitor structure by the same processes that formed the outriggers 117 and 118 around the gate 115. Outrigger 137 sits atop a feature 138 of the capacitor dielectric layer 135 and is formed by the same processes that formed features 119 and 121 of the transistor structure.

Figure 1:
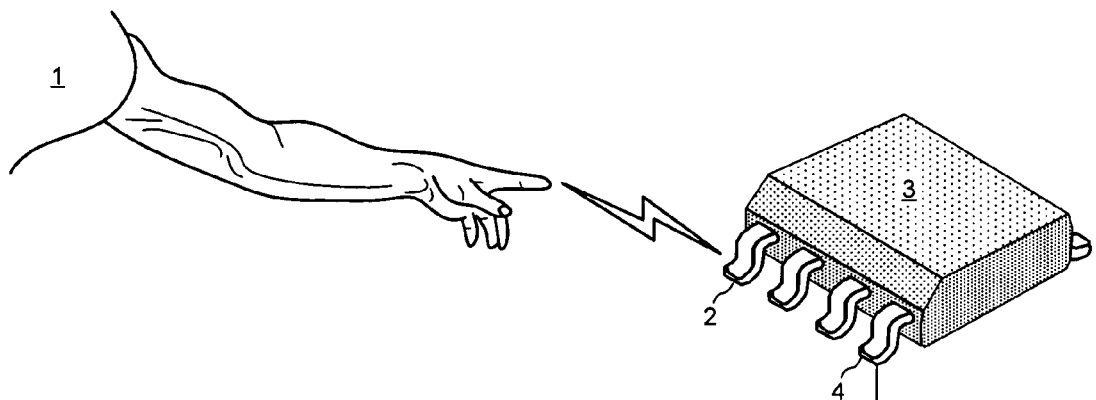
FIG. 1 (Prior Art) is a perspective view representing an electrostatic discharge (ESD) event through an integrated circuit package.
Figure 2:
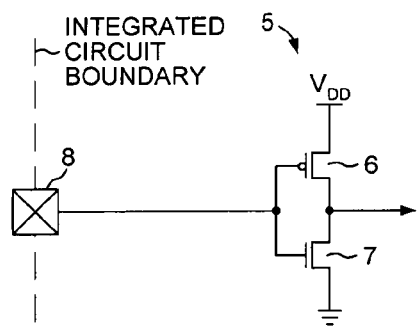
FIG. 2 (Prior Art) is a circuit diagram of an input buffer on the integrated circuit that can be damaged by the ESD event.
Figure 3:
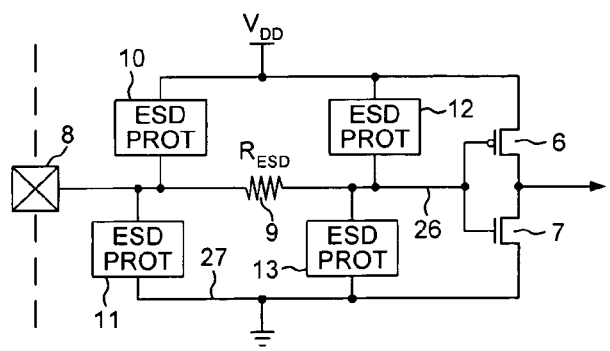
FIG. 3 (Prior Art) is a simplified circuit diagram of ESD protection circuitry that protects sensitive internal transistors of an input buffer.
Figure 4:
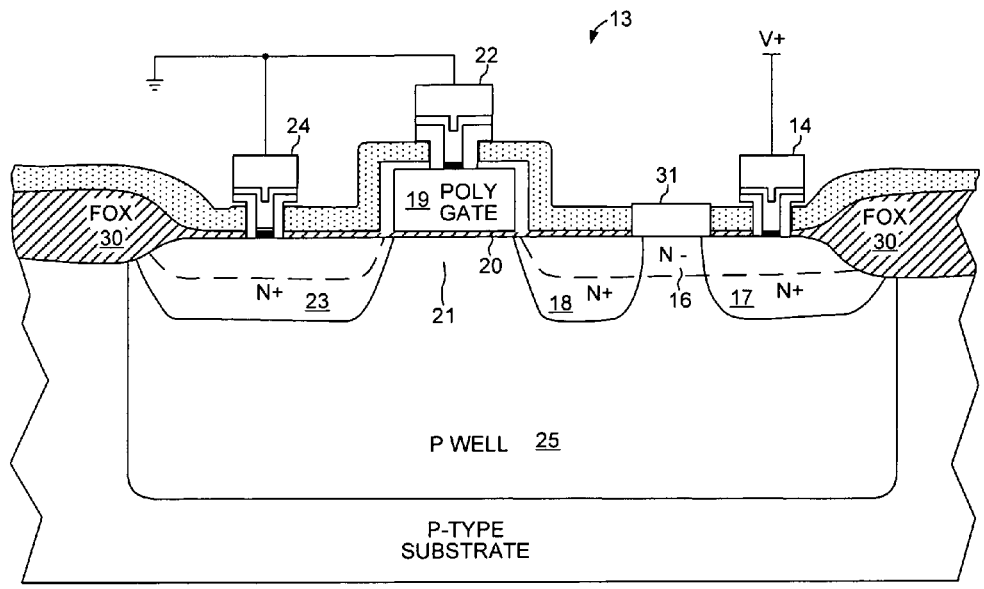
FIG. 4 (Prior Art) is a simplified cross-sectional diagram of an ESD protection structure of FIG. 3.
Figure 5:
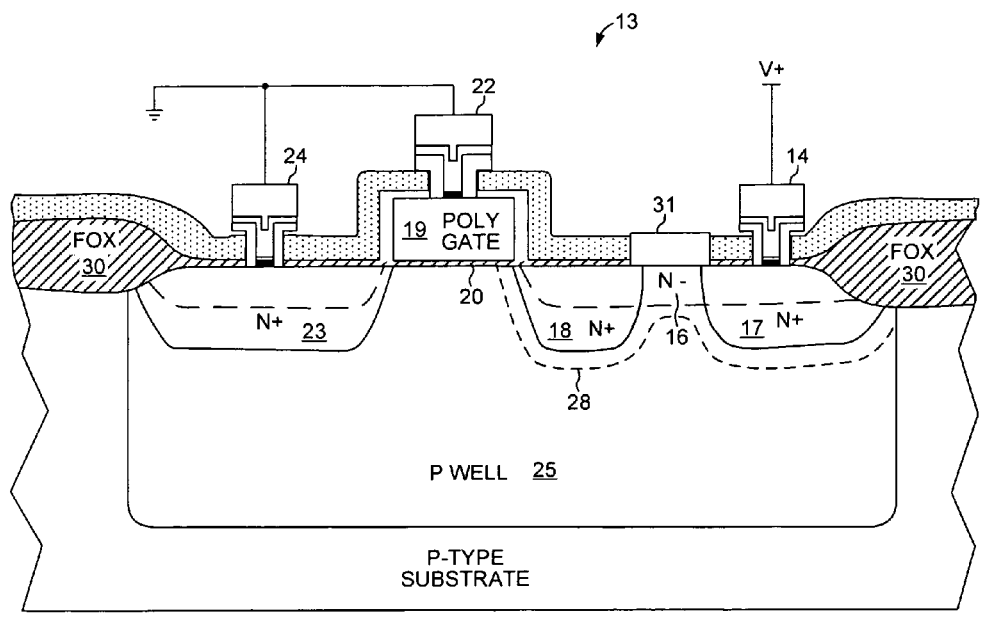
FIG. 5 (Prior Art) is a simplified cross-sectional diagram illustrating depletion regions of the ESD protection structure of FIG. 4.
Figure 6:
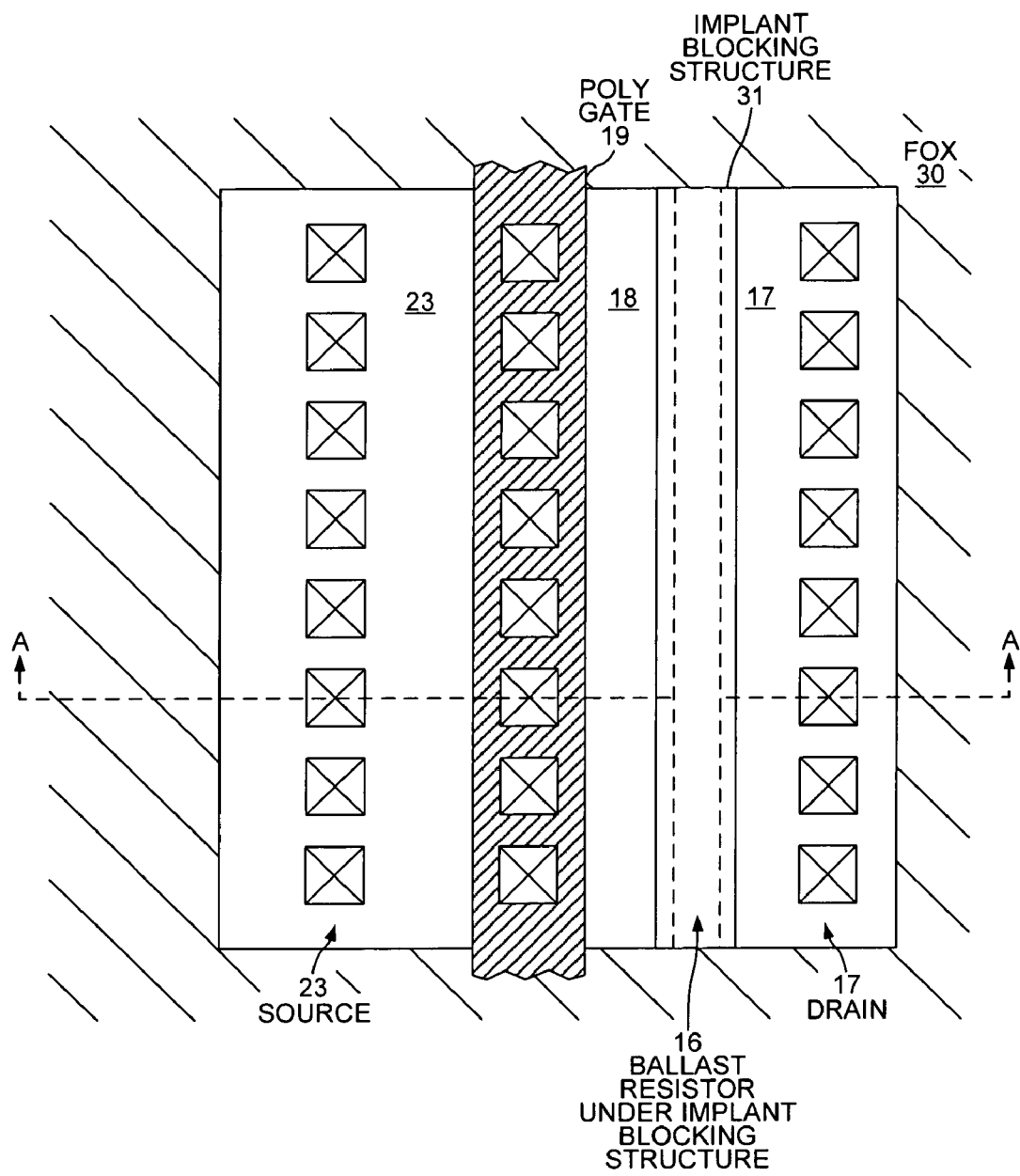
FIG. 6 (Prior Art) is a simplified top-down diagram of the ESD protection structure of FIG. 4.
Figure 7:
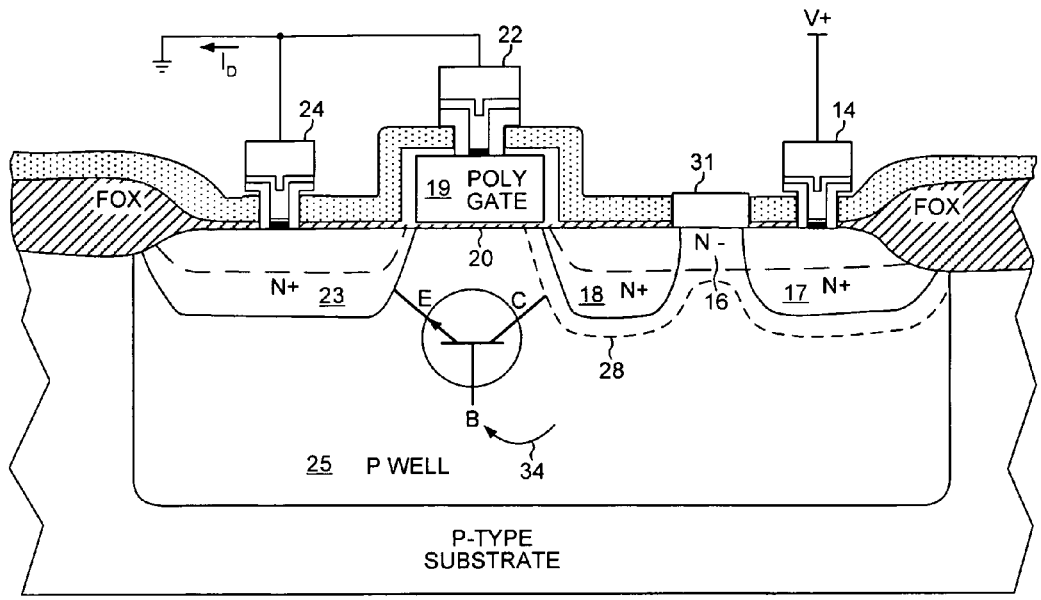
FIG. 7 (Prior Art) is a simplified cross-sectional diagram illustrating the operation of the ESD protection structure of FIG. 4.
Figure 8:
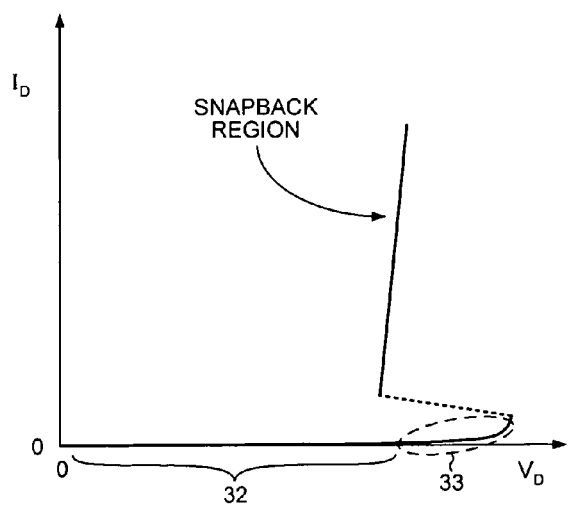
FIG. 8 (Prior Art) is a graph of the source-to-drain current $I_D$ as a function of the source-to-drain voltage $V_D$ of the ESD protection structure of FIG. 4.
Figure 9:
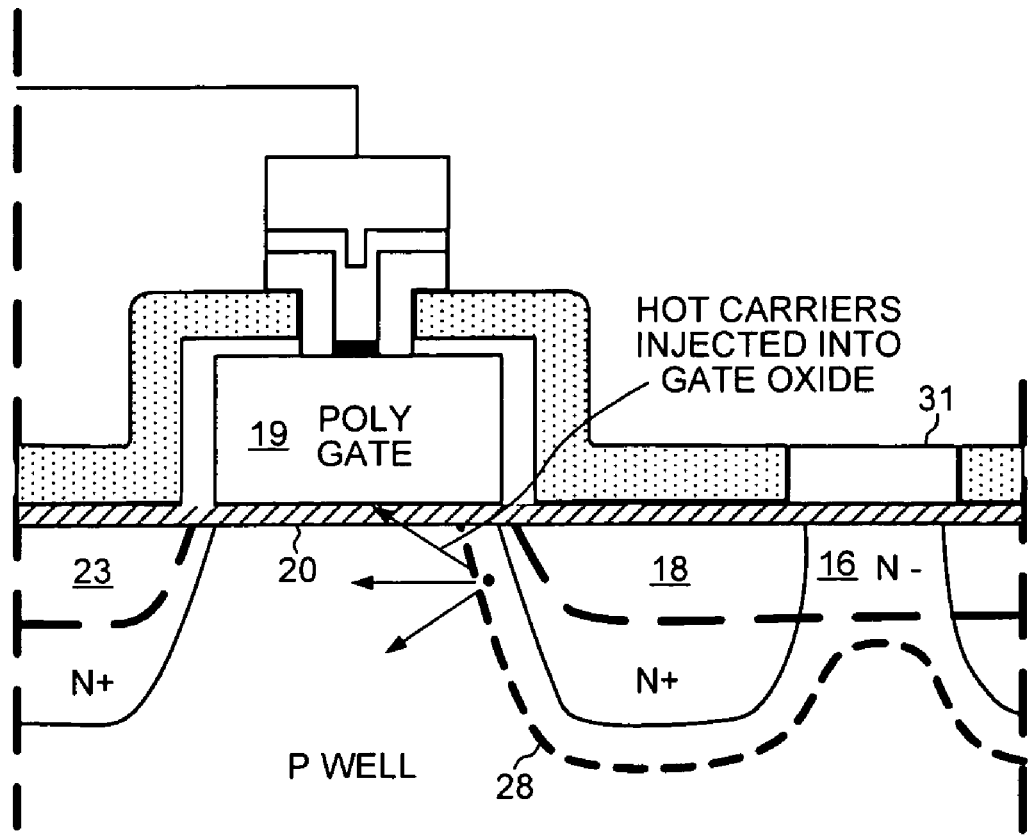
FIG. 9 (Prior Art) is a simplified cross-sectional diagram illustrating the emission of "hot carrier" electrons in the ESD protection structure of FIG. 4.
Figure 11:
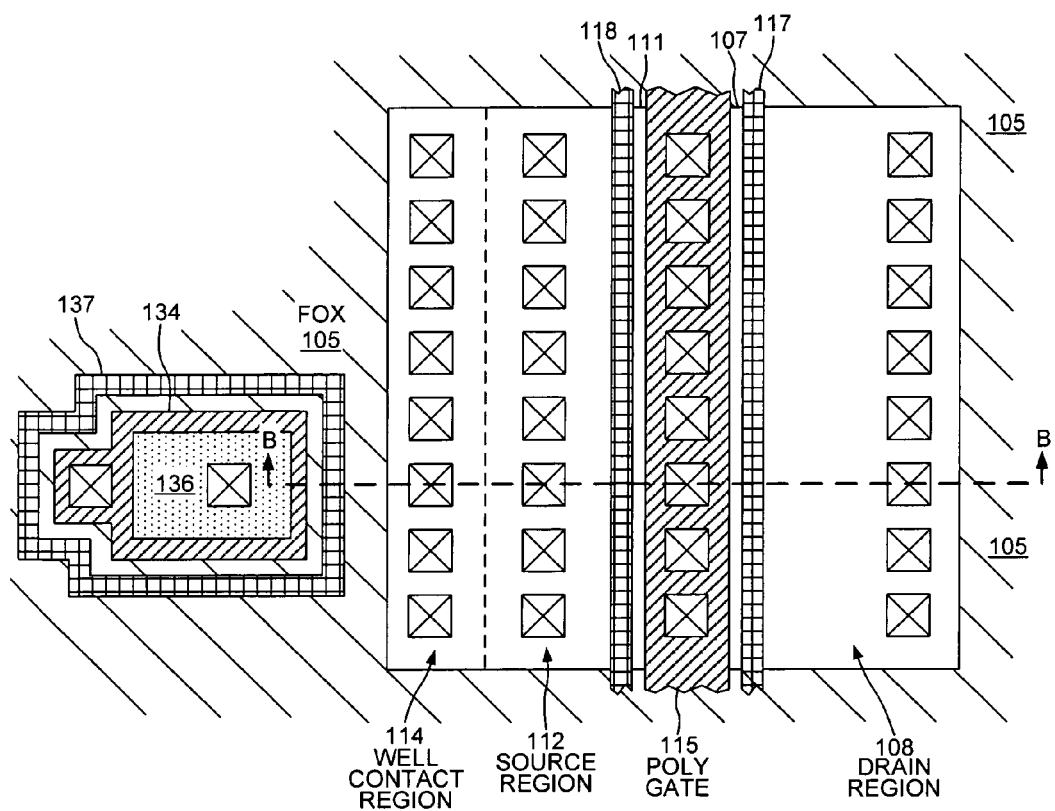
FIG. 11 is a top-down diagram of the structure of FIG. 10.

FIG. 11 is a top-down diagram of the structure of FIG. 10. In comparison to the conventional structure of FIG. 4, outriggers 117 and 118 are self-aligned and very closely spaced with respect to gate 115. Outriggers 117 and 118 are, in the illustrated embodiment, separated from gate 115 by approximately 0.2 to 0.4 microns. Outriggers 117 and 118 are also thin in comparison to the wide structure 31 of FIG. 4. Outriggers 117 and 118 are 0.05 microns to 0.2 microns wide. The narrowness of the outriggers 117 and 118 combined with the doping of the underlying regions 109 and 113 results in a relatively low resistance across regions 109 and 113. Lightly doped regions 109 and 113 have a phosphorus doping concentration of about from $1E18/cm^3$ to $5E18/cm^3$. In the illustrated embodiment, the resistance across regions 109 and 113 is less than approximately five ohms and is typically 0.1 to 1.0 ohms. Thus, the resistance of the underlying region 109 is significantly lower than the resistance of ballast resistor structure 16 of ESD protection structure 13. First N+ drain region 107 and second N+drain region 108 are doped with arsenic. Lightly doped N– region 109 is doped with phosphorus. The arsenic concentration in N+ region 107 and N+ region 108 is about $2E20/cm^3$, whereas the phosphorus concentration in the lightly doped N– region 109 is about from $1E18/cm^3$ to $5E18/cm^3$.

Figure 12:
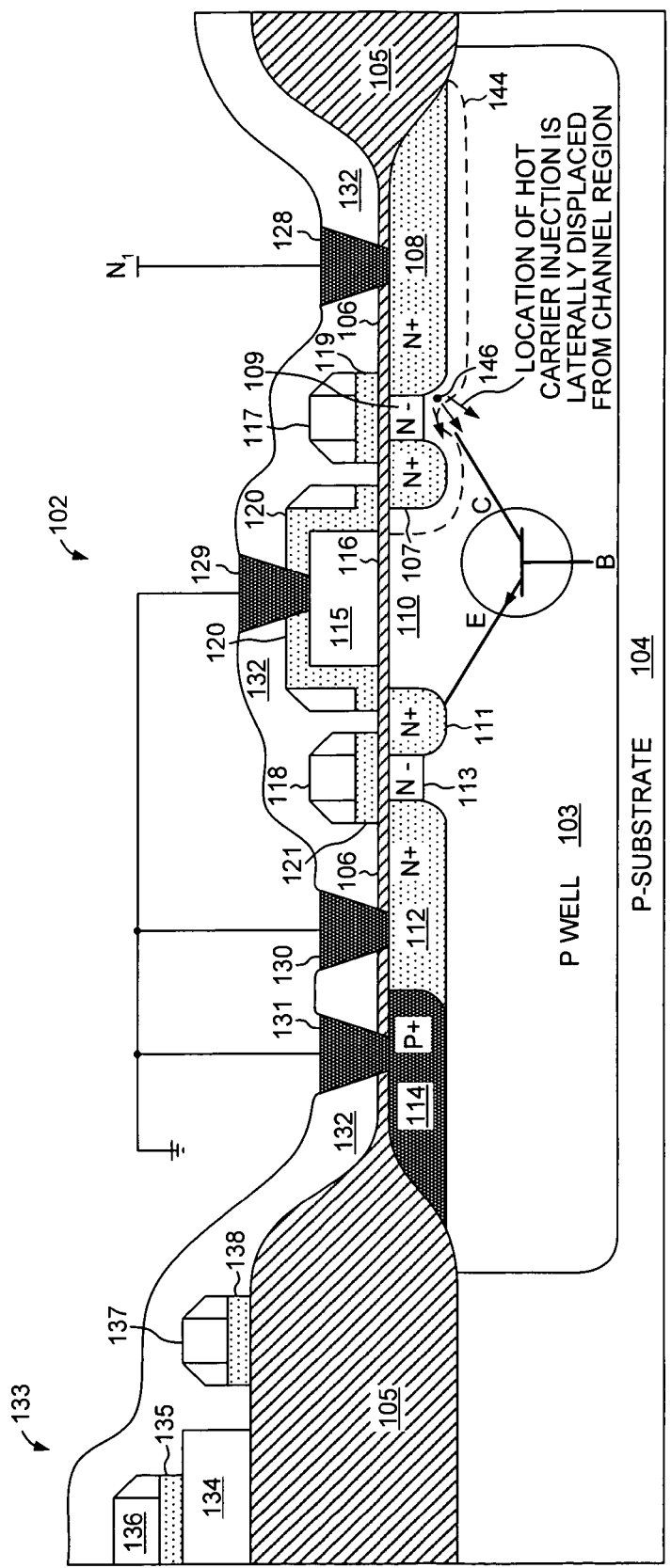
FIG. 12 is a simplified cross-sectional diagram illustrating the operation of the structure of FIG. 10.

FIG. 12 is a simplified cross-sectional diagram that illustrates an operation of the structure of FIGS. 10 and 11.

Figure 13:
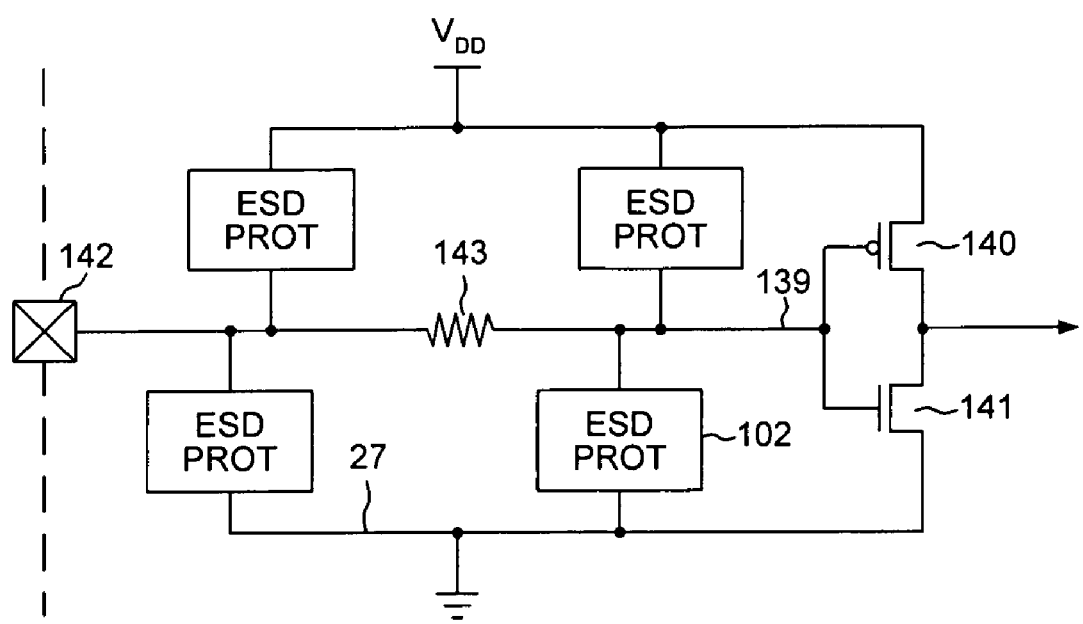
FIG. 13 is a simplified circuit diagram of a part of an input/output cell of which the ESD transistor structure of FIG. 10 is a part.

FIG. 13 illustrates a part of an input/output (I/O) cell of which the ESD transistor structure 102 of FIG. 10 is a part. Drain contact 128 of FIG. 12 is coupled to a node 139 and to the gates of the input transistors 140 and 141 to be protected from a high voltage ESD condition. When a high voltage is introduced onto the pad 142 of the I/O cell, a high voltage is communicated through resistor 143 and to drain contact 128. As a voltage builds between drain contact 128 and source contact 130, depletion region 144 expands downward into well 103. Due to the lightly doped region 109, the shape of the depletion region is deformed as illustrated in FIG. 12. It is believed that breakdown starts to occur at a location 146 in the vicinity of the boundary between N+ region 108 and N– region 109. It is believed that moving the location of initial avalanche breakdown moves the location from which hot carriers are emitted. By moving the location of injection of hot carriers laterally away from the channel region, it is believed that the accumulation of electrons in the gate oxide is reduced. Regardless of the details of the breakdown mechanism, a set of over twenty identical ESD transistor structures 102 were tested. Each transistor had a gate width of approximately 50 microns and a gate length of approximately 0.5 microns. The transistors went into snap back at between ten to fifteen volts, and the snap back clamp voltage was between five and ten volts. Each transistor conducted a current of at least 100 milliamperes, and over ninety percent of the transistors conducted a current of at least 100 milliamperes for a period of more than 30 seconds without causing a catastrophic failure of the ESD transistor structure. Thus, ESD transistor structure 102 is capable of electrically sinking more than about 2 milliamperes of current per micron of channel width without noticeable damage to the ESD transistor structure.

Advantageously, the ESD transistor structure 102 of FIG. 10 can be realized using a mixed signal process without the addition of process steps. The mixed signal process forms the ESD transistor structure at the same time that it forms the capacitor structure 133 of FIG. 10.

FIG. 14 is a process flow of some of the steps of a mixed signal process usable to realize ESD transistor structure 102 and capacitor structure 133.

Figure 15:
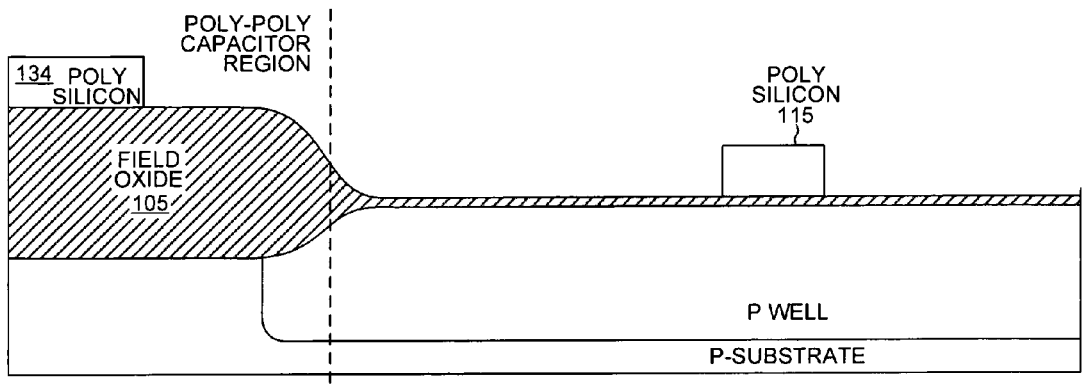
FIG. 15 is a simplified cross-sectional diagram of an initial stage in the process of FIG. 14.

FIG. 15 is a simplified cross-sectional diagram of an initial stage in the process. A layer of polysilicon is deposited, patterned and etched to form the first plate of the capacitor structure and the gate of the transistor structure.

Figure 16:
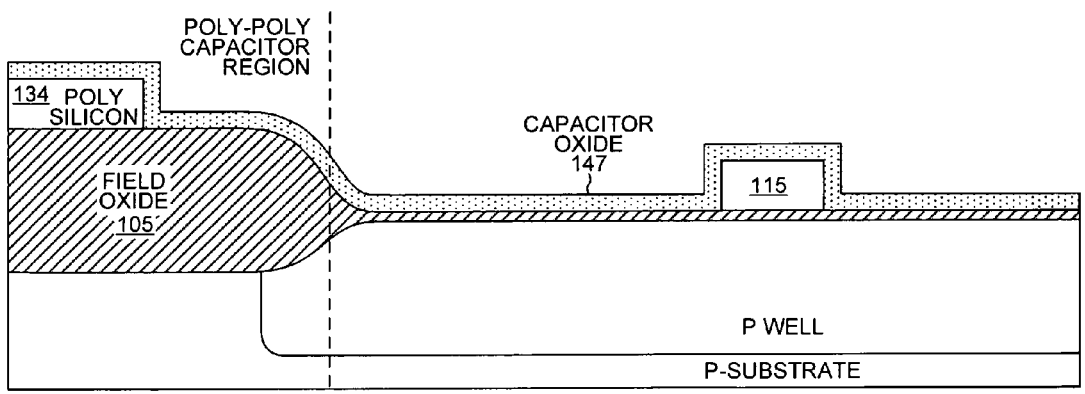
FIG. 16 is a simplified cross-sectional diagram of an oxide deposition step of the process of FIG. 14.

Next, step 1 of FIG. 14 is performed. A layer 147 of oxide 500 to 1000 angstroms thick is deposed over the entire structure of FIG. 15. The resulting structure is illustrated in FIG. 16.

Figure 17:
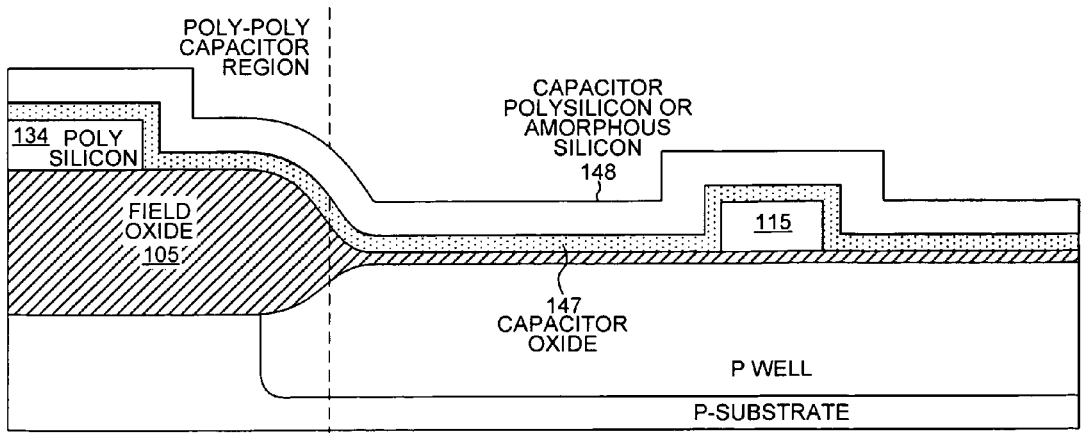
FIG. 17 is a simplified cross-sectional diagram of polysilicon deposition and doping steps of the process of FIG. 14.

Next, step 2 of FIG. 14 is performed. A layer 148 of polysilicon or amorphous silicon 1500 to 3000 angstroms thick is deposited over the entire structure of FIG. 16. In step 3, layer 148 is doped. In step 4, the dopant in layer 148 is activated. The resulting structure is illustrated in FIG. 17.

Figure 18:
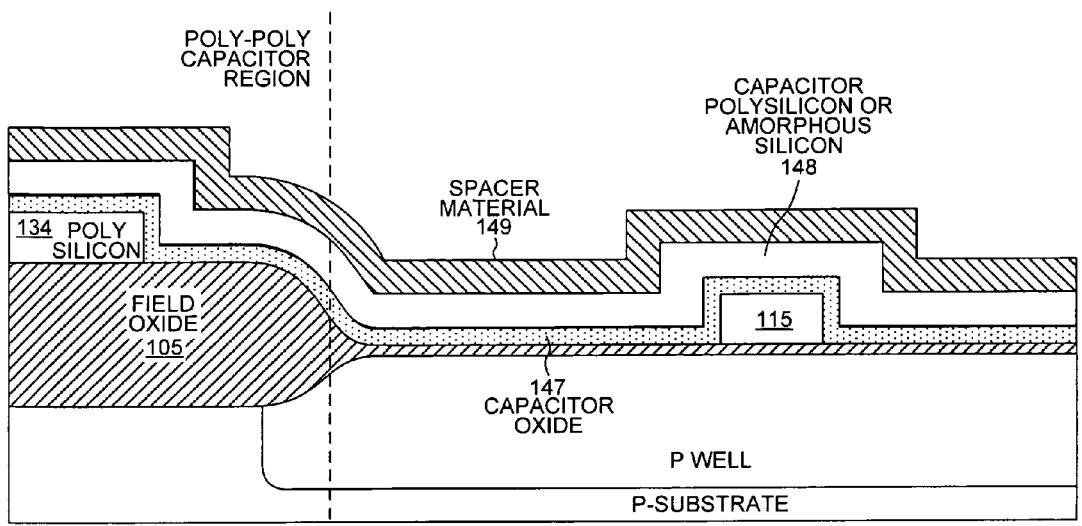
FIG. 18 is a simplified cross-sectional diagram of a spacer deposition step of the process of FIG. 14.

Next, step 5 of FIG. 14 is performed. A layer 149 of spacer material 500 to 3000 angstroms thick is blanket deposited over the entire structure of FIG. 17. The resulting structure is illustrated in FIG. 18.

Figure 19:
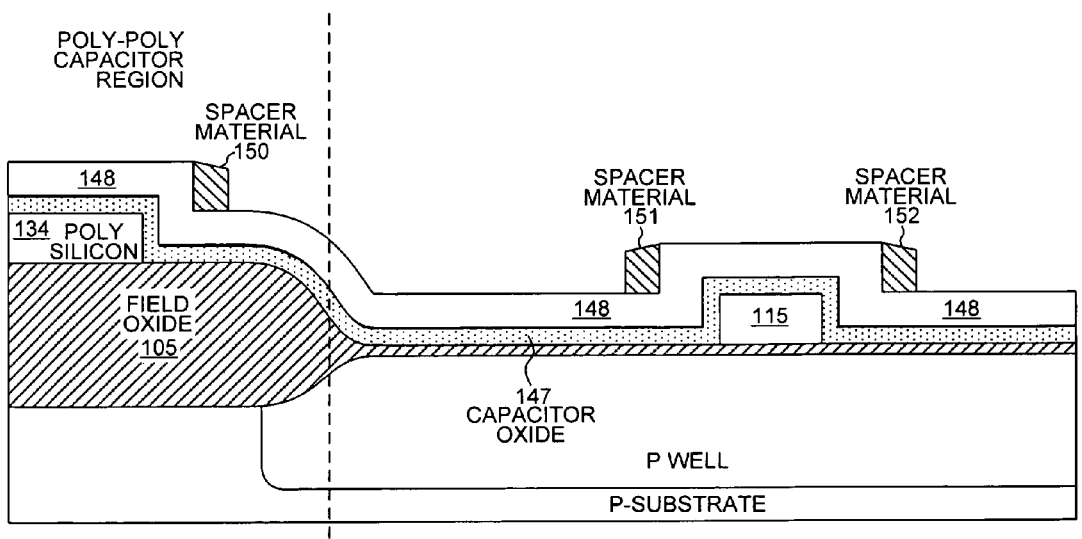
FIG. 19 is a simplified cross-sectional diagram of a spacer etching step of the process of FIG. 14.

Next, step 6 of FIG. 14 is performed. An anisotropic etch is performed to leave sidewall spacers 150-152 on the vertical sidewalls of layer 148. The sidewall spacers 150-152 remain after a period of anisotropic etching because the spacer material 149 is thicker around the corners of layer 148. The resulting structure is illustrated in FIG. 19.

Figure 20:
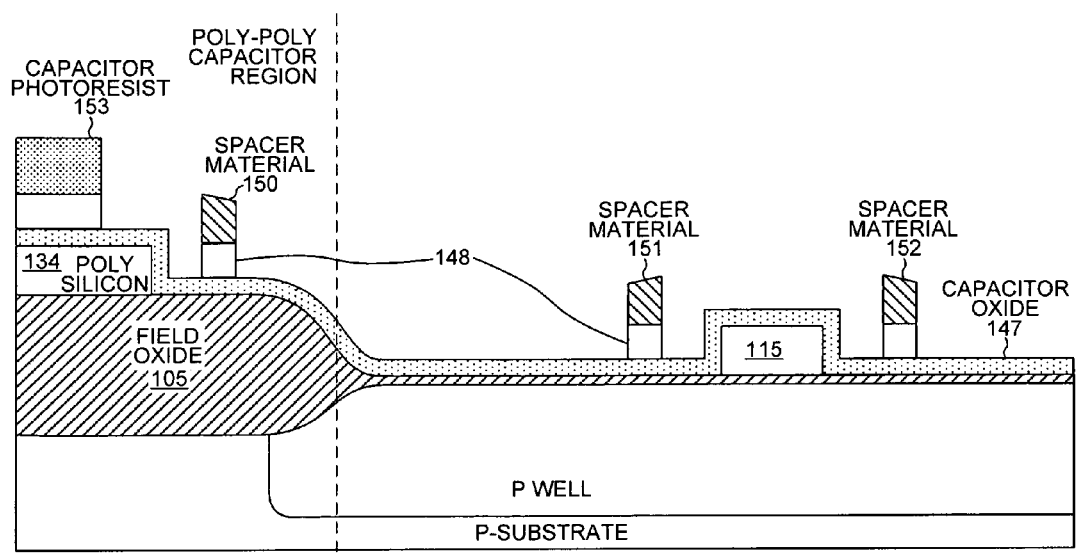
FIG. 20 is a simplified cross-sectional diagram of photomask and etching steps of the process of FIG. 14.

Next, step 7 of FIG. 14 is performed. The area of the second plate of the capacitor is protected with a photomask of photoresist 153. The unprotected areas of layer 148 are anisotropically etched away in step 8. Spacers 150-152 protect portions of layer 148 to form outriggers. The resulting structure is illustrated in FIG. 20.

Figure 21:
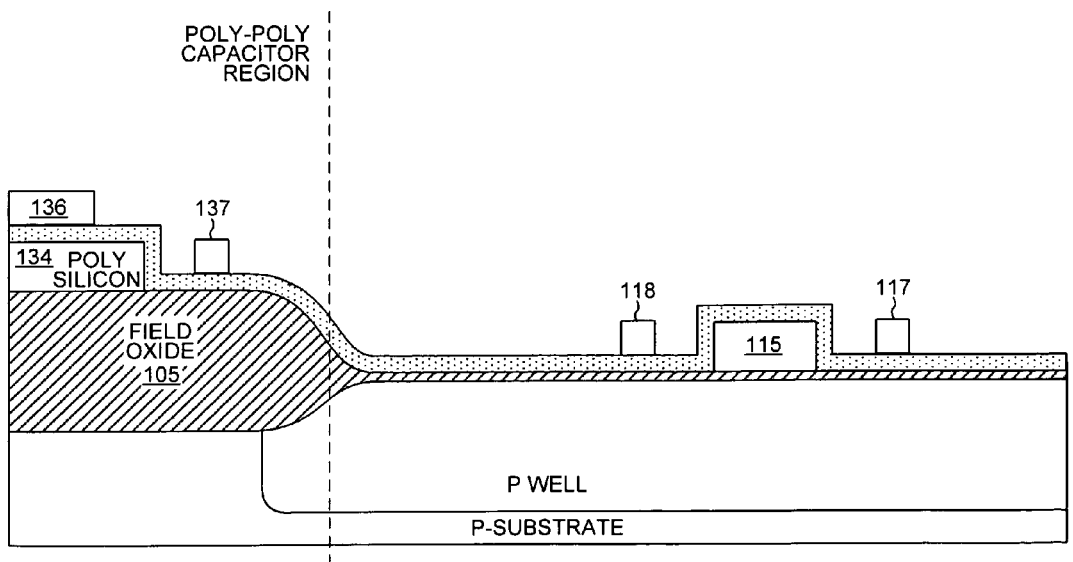
FIG. 21 is a simplified cross-sectional diagram of steps of the process of FIG. 14 involving photoresist and spacer removal.

Next, step 9 of FIG. 14 is performed. The protective photoresist 153 and spacers 150-152 are removed. The resulting structure is illustrated in FIG. 21. The second plate 136 remains, as well as outriggers 117 and 118.

Figure 22:
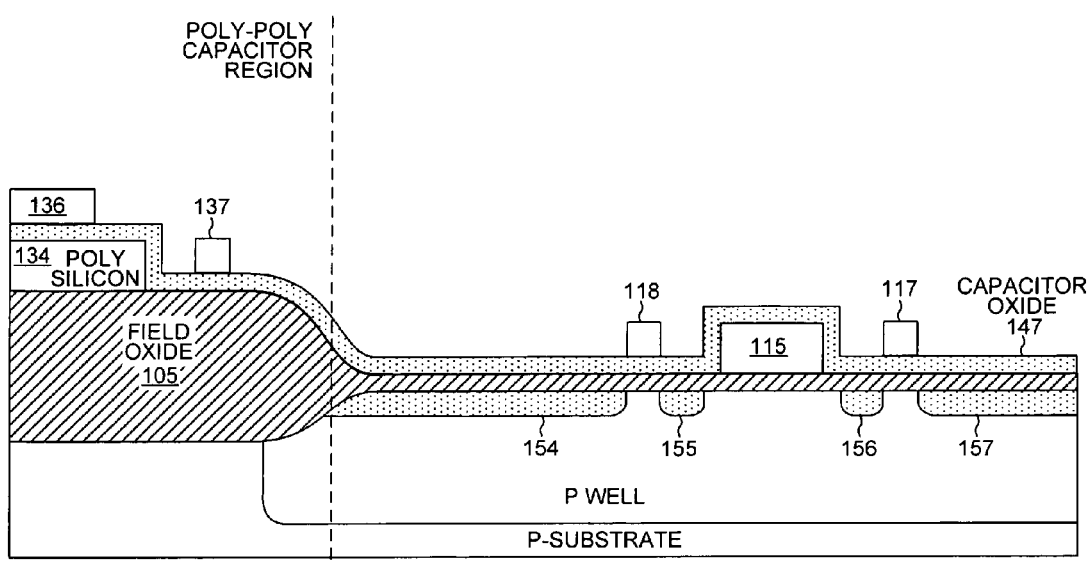
FIG. 22 is a simplified cross-sectional diagram of steps of the process of FIG. 14 involving a lightly doped drain (NLDD) implant.

Next, steps 10, 11 and 12 of FIG. 14 are performed. A layer of photoresist is applied and patterned to form a mask that masks the entire structure but for the area to receive a lightly doped drain (NLDD) implant of N type dopants. The N type dopants are then implanted, and the photomask is removed. The resulting structure including N– type implant regions 154-157 is illustrated in FIG. 22.

Next, step 14 of FIG. 14 is performed. A layer of spacer oxide is deposited and etched to leave sidewall spacers 122-127 and 158-160. A thin 100 to 200 angstrom implant screen oxidation step is performed (step 15). A photoresist layer is then patterned and etched to form a mask over all regions not to receive an N type source-drain implant.

Figure 23:
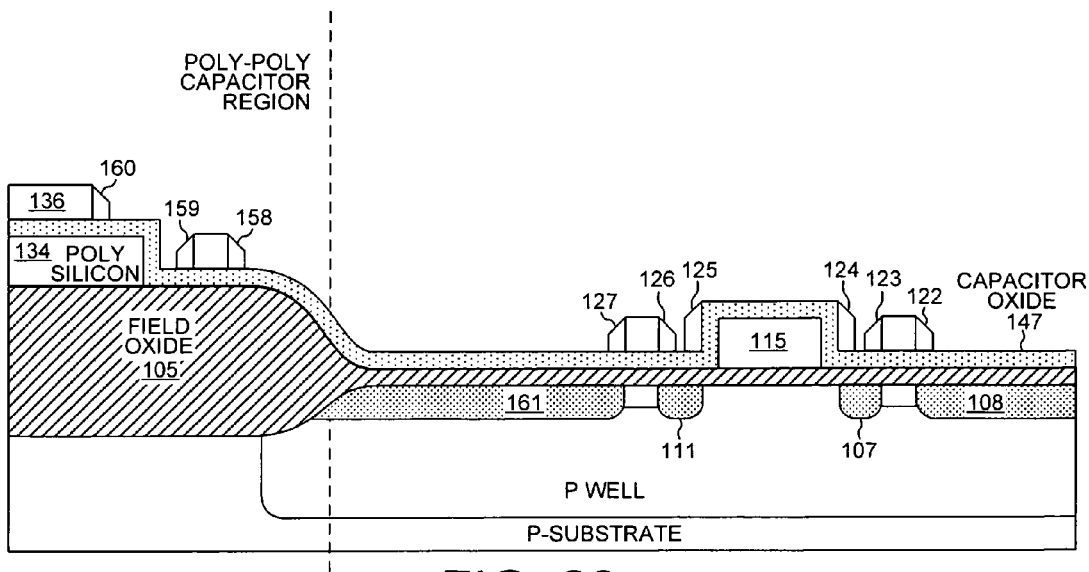
FIG. 23 is a simplified cross-sectional diagram of steps of the process of FIG. 14 involving an N type source-drain implant.

Next, step 17 of FIG. 14 is performed. N type dopants are implanted using the source-drain implant mask. The mask is then stripped away in step 18. The resulting structure including N+ type regions 108, 107, 111 and 161 is illustrated in FIG. 23.

Next, step 19 of FIG. 14 is performed. A photoresist layer is patterned and etched to leave areas to receive a P type implant exposed. In the case of the ESD transistor structure, this is the area of P+ type source contact region 114 of FIG. 10. A P type implant is performed thereby forming P+ type contact region 114. The photomask is removed. A layer of BPSG is deposited in step 20, and the passivation is densified at 900 to 950 degrees Celsius in an oxygen containing ambient in step 21. A photomask is formed to leave the areas where contacts will be exposed, and holes into the passivation layer are etched in step 22. After a RTP reflow of 20 to 40 seconds at 900 to 950 degrees Celsius, metal is deposited, patterned and etched to form the overlying (not illustrated) electrodes and metal interconnection of the integrated circuit. FIGS. 10 and 11 are simplified views of the resulting structure without overlying metalization layers.

Although the present invention has been described in connection with certain specific embodiments for instructional purposes, the present invention is not limited thereto. An ESD transistor structure employing outriggers with underlying shallow lightly doped regions can also include a first lightly doped region between its drain region and its channel region, as well as a second lightly doped region between its channel region and its source region such that the first and second lightly doped regions adjoin the channel region.

Although a single lightly doped region 109 is illustrated above as being under outrigger 117 and extending from first drain region 107 to second drain region 108, the lightly doped region under the outrigger need not include N type silicon all the way from first drain region 107 to second drain 108 but rather can include a thin intervening region of P well material. Thus, there can be two lightly doped regions. If, for example, the feature size of the outrigger is 0.2 microns wide, the N type dopant of the lightly doped region may laterally "straggle" during the implant approximately 0.03 microns under the edges of the outrigger. The built-in potential of the resulting lightly doped drain regions to the P well material will add depletion regions of approximately 0.04 microns to the side edge of each lightly doped region. Accordingly, without any lateral diffusion in subsequent thermal cycles of dopants in the lightly doped region, the effective edge of a first lightly doped region will begin approximately 0.07 microns laterally from the edge of first drain region 107 toward second drain region 108. Similarly, an effective edge of a second lightly doped region will extend approximately 0.07 microns laterally from the edge of second drain region 108 toward first drain region 107. Thus, a thin intervening region of P well material that is 0.06 microns wide separates the two lightly doped regions before lateral diffusion from a thermal cycle. Even if the first and second lightly doped regions do not actually touch one another in electrically neutral conditions, the two lightly doped regions will effectively touch one another in an ESD event when the depletion regions of the two lightly doped regions expand. An embodiment is therefore disclosed wherein a lightly doped region under an outrigger is not contiguous lightly doped material all the way from first drain region 107 to second drain region 108.

Accordingly, various modifications, adaptations, and combinations of various features of the described embodiments can be practiced without departing from the scope of the invention as set forth in the claims.

What is claimed is:

1. A method comprising:
   (a) depositing a dielectric over a gate electrode, wherein the gate electrode extends in a first dimension;
   (b) depositing a silicon material over the dielectric;
   (c) depositing a spacer material over the silicon material;
   (d) etching the spacer material to form a sidewall spacer;
   (e) etching the silicon material to form an outrigger beneath the sidewall spacer, wherein the outrigger extends parallel to the gate electrode in the first dimension, wherein the outrigger is separated from the gate electrode by at most approximately 0.4 microns, wherein the outrigger is self-aligned with respect to the gate electrode, wherein the outrigger has a width of approximately between 0.05 microns and 0.2 microns, and wherein the gate electrode is part of an electrostatic discharge (ESD) transistor structure; and
   (f) using the outrigger as an implant blocking structure to form a lightly doped region beneath the outrigger.

2. The method of claim 1, further comprising:
   (g) forming a first drain region and a second drain region on either side of the lightly doped region, wherein a resistance from the first drain region to the second drain region through the lightly doped region is less than approximately five ohms.

3. The method of claim 1, wherein the gate electrode has a width, wherein a channel region lies beneath the gate electrode, wherein the lightly doped region lies between the channel region and a drain region, further comprising:
   (g) conducting a current of at least two milliamperes per micron of gate width into the drain region and through the ESD transistor structure for a period of more than 30 seconds without causing a catastrophic failure of the ESD transistor structure.

4. The method of claim 1, wherein the gate electrode has a gate width, and wherein a current of at least two milliamperes per micron of gate width can flow into and through the ESD transistor structure for a period of more than 30 seconds without causing a catastrophic failure of the ESD transistor structure.

5. The method of claim 1, wherein the etching in (d) and the etching in (e) are performed anisotropically.

6. The method of claim 1, further comprising:
   (g) covering the outrigger with a passivation layer.

7. The method of claim 1, further comprising:
   (g) forming a capacitor structure comprising a first plate and a second plate, the second plate being made of the silicon material and having a thickness, the outrigger also being made of the silicon material and having the thickness.

8. The method of claim 7, wherein the outrigger is separated from the gate electrode by the dielectric, and wherein the first plate is separated from the second plate by the dielectric.

9. The method of claim 1, wherein the gate electrode is part of an electrostatic discharge (ESD) transistor structure and has a gate width, wherein a channel region underlies the gate electrode, wherein the ESD transistor structure has a drain contact and a source contact, further comprising:
   (g) using the outrigger as the implant blocking structure to form a first drain region and a second drain region, wherein during an ESD event a high voltage that builds between the drain contact and the source contact causes an avalanche breakdown current to flow from the first and second drain regions toward the source contact; and
   (h) moving a location where the avalanche breakdown current begins laterally away from the channel region such that a current of at least two milliamperes per micron of gate width can flow into and through the ESD transistor structure for a period of more than 30 seconds without causing a catastrophic failure of the ESD transistor structure.

10. The method of claim 1, wherein the silicon material is conductive.

11. The method of claim 1, wherein the silicon material is taken from the group consisting of: polysilicon and amorphous silicon.

12. The method of claim 2, wherein the first drain region and the lightly doped region are formed in a semiconductor bulk, and wherein the first drain region extends deeper from a surface of the semiconductor bulk into the semiconductor bulk than does the lightly doped region.

13. The method of claim 1, wherein the ESD transistor structure is fabricated around logic transistors in the center of an integrated circuit.

* * * * *